United States Patent
Liu et al.

(10) Patent No.: US 8,325,518 B2
(45) Date of Patent: Dec. 4, 2012

(54) MULTI-LEVEL CELL NOR FLASH MEMORY DEVICE

(75) Inventors: Sheng-Da Liu, Chu-Pei (TW); Yider Wu, Chu-Pei (TW)

(73) Assignee: Eon Silicon Solution Inc. (TW)

( * ) Notice: Subject to any disclaimer, the term of this patent is extended or adjusted under 35 U.S.C. 154(b) by 104 days.

(21) Appl. No.: 12/976,284

(22) Filed: Dec. 22, 2010

(65) Prior Publication Data

US 2012/0163077 A1 Jun. 28, 2012

(51) Int. Cl.
*G11C 11/34* (2006.01)

(52) U.S. Cl. ......... 365/185.03; 365/185.01; 365/185.05; 365/185.06; 365/185.1; 365/185.12; 365/185.17; 365/185.33

(58) Field of Classification Search .............. 365/185.01, 365/185.03, 185.05, 185.06, 185.1, 185.12, 365/185.17, 185.33
See application file for complete search history.

(56) References Cited

U.S. PATENT DOCUMENTS

| | | | | |
|---|---|---|---|---|
| 5,828,602 A | * | 10/1998 | Wong | 365/185.2 |
| 8,089,114 B2 | * | 1/2012 | Kim et al. | 257/315 |
| 2011/0177661 A1 | * | 7/2011 | Song et al. | 438/264 |

* cited by examiner

*Primary Examiner* — Fernando Hidalgo
(74) *Attorney, Agent, or Firm* — Schmeiser, Olsen & Watts, LLP

(57) ABSTRACT

A multi-level cell NOR flash memory device includes a plurality of gate lines, a plurality of source regions, a plurality of drain regions, a plurality of source lines, a plurality of bitlines, and a plurality of power lines. The bitlines each have a specific sheet resistance. A specific number of the bitlines are disposed between two adjacent ones of the power lines. Accordingly, the multi-level cell NOR flash memory device is of a high transconductance and uniformity and thereby features an enhanced conforming rate.

3 Claims, 3 Drawing Sheets

MULTI-LEVEL CELL NOR FLASH MEMORY DEVICE

FIELD OF THE TECHNOLOGY

The present invention relates to NOR flash memory devices, and more particularly, to a multi-level cell NOR flash memory device effective in enhancing the performance of semiconductor.

BACKGROUND

Due to the ever-increasing functionality of electronic products, such as mobile phones, MP3 players, audiovisual players, digital cameras, and e-books, system data are not only becoming more voluminous, but also depend on reliable and high-speed access speed. Hence, flash memory manufacturers endeavor to increase memory density and access speed of a chip. To this end, it is feasible to have the layout of flash memory switching from single level cells (SLC) to multi-level cells (MLC). MLC technology is the key to fabrication of multi-level high-density flash memory components and is effective in achieving relatively large storage capacity and high access speed.

NOR flash memory is advantageously characterized by high-speed programming and erasing, complete addresses and data interfaces, and random reading. Hence, NOR flash memory is fit for use in memory that is seldom updated, such as BIOS or firmware. As regards its service life, NOR flash memory has 10,000 to 1,000,000 erasing cycles. In addition to PC motherboards (that store BIOS data in NOR flash memory), NOR flash memory is used in hand-held electronic devices (that store system data in NOR flash memory for starting the hand-held electronic devices at the high reading speed of NOR flash memory.)

However, the reading/programming process of flash memory is accompanied by generation of parasitic capacitance that inevitably decreases the applied voltage from the very beginning. The aforesaid phenomenon accounts for a decrease in the uniformity of distribution of critical voltage applied to memory cells. Since the critical voltage is an important parameter of a flash memory device, decreased uniformity leads to a reduction in the performance and conforming rate of the devices produced.

SUMMARY

It is an objective of the present invention to provide a multi-level cell NOR flash memory device of a satisfactory transconductance (GM).

Another objective of the present invention is to provide a multi-level cell NOR flash memory device characterized by a high degree of uniformity among the memory cells of the multi-level cell NOR flash memory device.

In order to achieve the above and other objectives, the present invention provides a multi-level cell NOR flash memory device, comprising: a plurality of gate lines separated from a semiconductor substrate by a gate insulating layer, wherein the gate lines each have a metal silicide layer; a plurality of source regions and a plurality of drain regions formed in the semiconductor substrate and between the gate lines; a plurality of source lines connected to a portion of the source regions and each being of a sheet resistance of 100 to 300 ohm/sq; a plurality of bitlines perpendicular to the source lines and each electrically connected to the drain regions through a plurality of drain contacts; and a plurality of power lines parallel to the bitlines and each electrically connected to the source lines through a plurality of source contacts, wherein 16 said bitlines are disposed between two adjacent ones of the power lines.

In an embodiment, the NOR flash memory device comprises a soft-programming procedure.

In an embodiment, the semiconductor substrate is a silicon (Si) substrate.

In an embodiment, a metal of the metal silicide layer is cobalt or titanium.

Given the architecture of a multi-level cell NOR flash memory device proposed by the present invention, the multi-level cell NOR flash memory device is of a relatively high transconductance (GM). The higher the transconductance (GM), the higher a drain current can be driven by a small change in a gate bias voltage to thereby reduce the parasitic capacitance which might otherwise be unnecessarily generated. Hence, the multi-level cell NOR flash memory device of the present invention is not only advantageously characterized by a relatively high transconductance (GM) and uniformity as far as its electrical performance is concerned, but also features an enhanced conforming rate, high capacity, high speed, and high stability.

BRIEF DESCRIPTION OF THE DRAWINGS

A detailed description of further features and advantages of the present invention is given below so that a person skilled in the art can understand and implement the technical contents of the present invention and readily comprehend the objectives, features, and advantages thereof by reviewing the disclosure of the present specification and the appended claims in conjunction with the accompanying drawings, in which:

DETAILED DESCRIPTION

Figure 1:
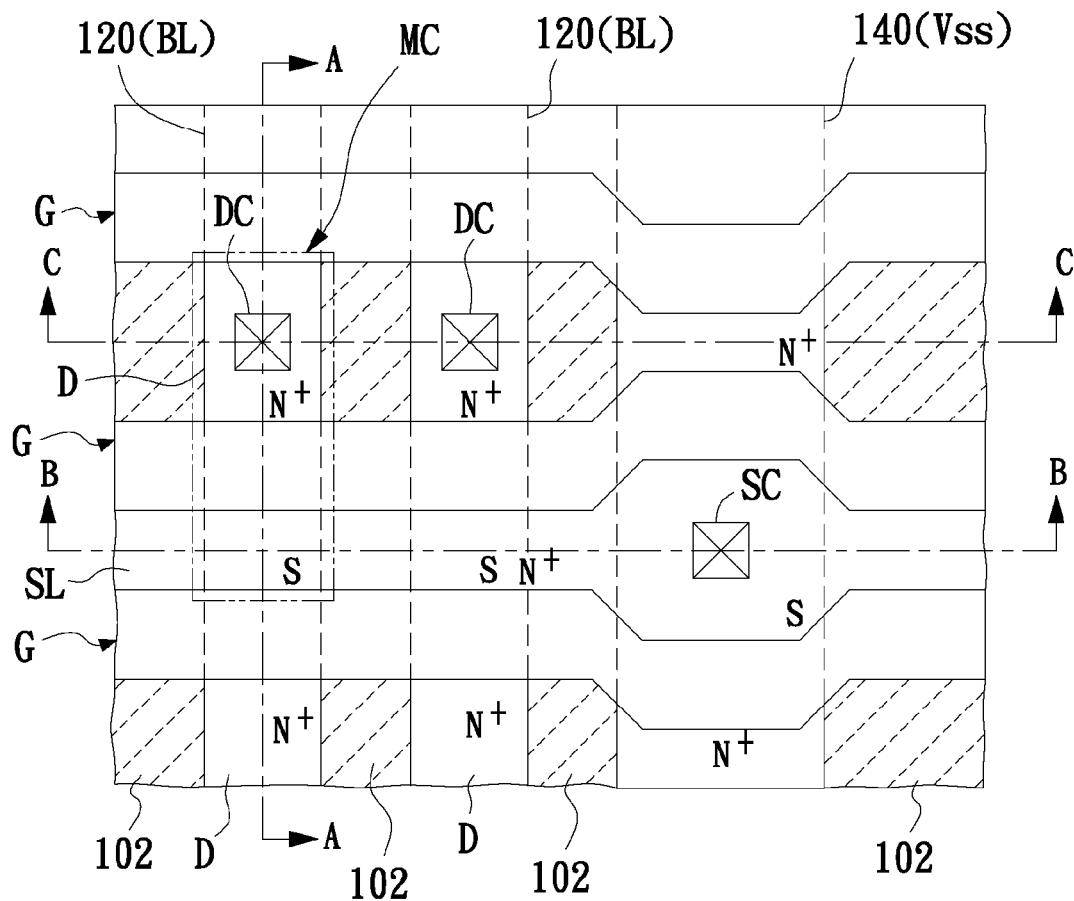
FIG. 1 is a partial schematic top view of a multi-level cell NOR flash memory device according to an embodiment of the present invention.

Referring to FIG. 1, there is shown a partial schematic top view of a multi-level cell NOR flash memory device according to an embodiment of the present invention. As shown in the drawing, a plurality of gate lines G are extended in the row direction (i.e., from the left to the right as shown in the drawing). Each of the gate lines G is provided with spaces which are separated by required intervals along the gate line G and oriented in the column direction (i.e., from the top to the bottom as shown in the drawing). The spaces each receive a source contacts SC. As shown in the drawing, a plurality of component insulating structures 102 are substantially perpendicular to the gate lines G. Two adjacent ones of the gate lines G and two adjacent ones of the component insulating structures 102 together define a drain region D therewithin. A drain contact DC is formed on top of each of the drain regions D and electrically connected to a bitline 120 (indicated by a dashed line in the drawing). The bitlines 120 are extended in the column direction and electrically connected to all the drain contacts DC disposed along the same column The bitlines 120 are perpendicular to a plurality of source lines 128

(see FIG. 2B) disposed between two adjacent ones of the gate lines G and formed on source regions S. The source lines 128 are electrically connected to a power line 140 (Vss, as indicated by a dashed line in the drawing) via the source contacts SC. A memory cell (MC) comprises a gate structure (including a control gate CG and a floating gate FG, see FIG. 2A) and the adjacent ones of the drain regions D and the source regions S.

Figure 2A:
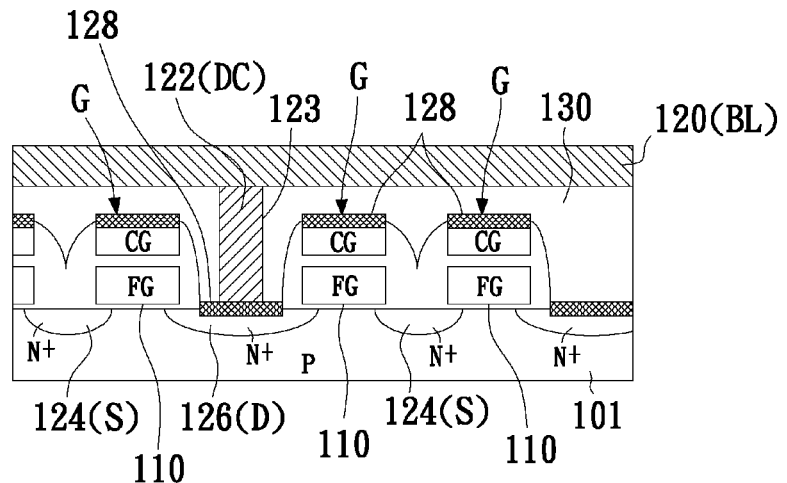
FIG. 2A is a cross-sectional view taken along line A-A of FIG. 1.
Figure 2B:
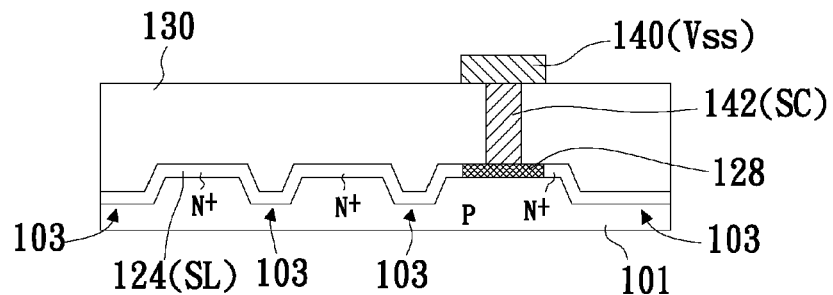
FIG. 2B is a cross-sectional view taken along line B-B of FIG. 1.
Figure 2C:
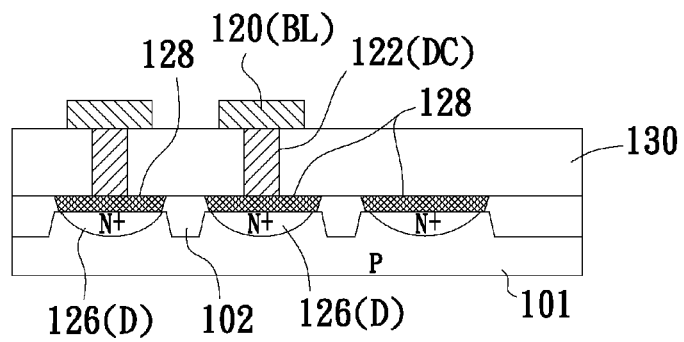
FIG. 2C is a cross-sectional view taken along line C-C of FIG. 1.

Referring to FIGS. 2A, 2B, and 2C, there are shown cross-sectional views taken along line A-A, line B-B, and line C-C of FIG. 1, respectively.

Referring to FIG. 2A, the gate lines G each comprise the control gates CG aligned in the row direction and configured to control a word line and the floating gates FG each formed beneath a corresponding one of the control gates CG. The floating gates FG are separated from a semiconductor substrate 101 by a gate insulating layer 110. The gate insulating layer 110 is a tunnel oxide layer. To speed up the operation of the memory cells (MC), it is feasible for a metal silicide layer 128 to contain a transition metal, preferably cobalt or titanium, which is formed on the surface of the control gates CG and the drain regions D. In a preferred embodiment, the metal of the metal silicide layer 128 is cobalt or titanium. Referring to FIG. 1, a plurality of impurity diffusing layers 124 (S), 126 (D) which function as the source regions S and the drain regions D are aligned in the column direction and disposed between the gate lines G. Referring to FIG. 1, the drain regions D are aligned in the row direction and disposed discretely in the spacing formed between the component insulating structures 102. An interlayer dielectric 130 is formed above the gate lines G and the metal silicide layer 128. Formed in the interlayer dielectric 130 is a drain contact window 123 for receiving a metal 122 (DC) that functions as the drain contacts DC. Formed on top of the interlayer dielectric 130 is the bitlines 120 (BL) shown in FIG. 1 and disposed in the column direction.

The semiconductor substrate 101 of the present invention is a silicon (Si) substrate, a silicon-germanium (SiGe) substrate, a silicon on insulator (SOI) substrate, a silicon-germanium on insulator (SGOI) substrate, or a germanium on insulator (GOI) substrate. In this embodiment, the semiconductor substrate 101 is exemplified by a silicon (Si) substrate, and is doped with boron. Hence, the semiconductor substrate 101 is a P-type semiconductor substrate, whereas the source regions S and the drain regions D are N-doped. However, persons skilled in the art are well aware that it is also feasible for the semiconductor substrate 101 to be an N-type semiconductor substrate and for both the source regions S and the drain regions D to be P-doped.

Referring to FIG. 2B, a metal 142 (SC) that functions as each of the source contacts SC is connected to the power line 140 (Vss). The power line 140 (Vss) is electrically connected, in the column direction shown in FIG. 1, to the source contacts SC aligned in the same column As shown in FIG. 2B, the impurity diffusing layer 124 crosses a plurality of component insulating grooves 103 (resulting from the etching of a portion of the component insulating structures 102) so as to be converted into a plurality of source lines SL aligned in the row direction shown in FIG. 1. In an embodiment of the present invention, given well-controlled conditions of implantation, the source lines SL resulting from the impurity diffusing layer 124 (SL) is of a sheet resistance of 100 to 300 ohm/sq.

Referring to FIG. 2C, the metal 142 (SC) that functions as the drain contacts DC is connected to the bitlines 120 (BL) so as to become a circuit on the interlayer dielectric 130.

Figure 3:
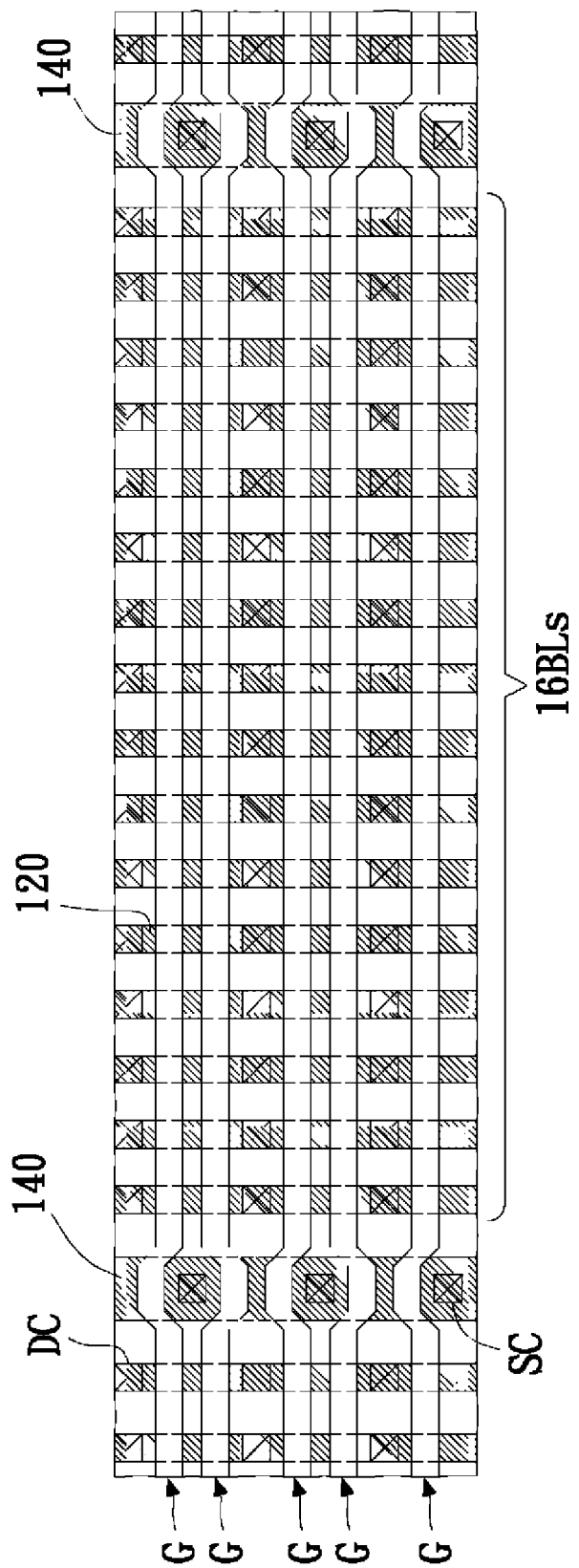
FIG. 3 is another partial schematic top view of a multi-level cell NOR flash memory device according to an embodiment of the present invention.

FIG. 3 is another partial schematic top view of a multi-level cell NOR flash memory device according to an embodiment of the present invention. As shown in the drawing, 16 said bitlines 120 (BL) are disposed between two adjacent ones of the power lines 140 (Vss). The power lines 140 (Vss) are parallel to the bitlines 120 (BL). The power lines 140 (Vss) are each electrically connected to the source lines SL through a plurality of source contacts SC (see FIG. 2B).

A method for fabricating a multi-level cell NOR flash memory device according to an embodiment of the present invention comprises the steps of:

(1) forming a plurality of component insulating structures 102 in a semiconductor substrate 101;

(2) forming a gate insulating layer 110 on the semiconductor substrate 101 and the component insulating structures 102;

(3) forming a gate structure on the gate insulating layer 110, followed by forming a plurality of gate lines G by a patterning process;

(4) etching a portion of the component insulating structures 102, followed by performing an implantation process using the gate lines G as a mask to thereby form a plurality of source regions S and a plurality of drain regions D in the semiconductor substrate 101 on two sides of the gate lines;

(5) forming a metal silicide layer 128 on the drain regions D and the gate lines G, wherein the impurity diffusing layer 124 (SL) functions as a plurality of source lines SL (see FIG. 1) of a sheet resistance of 100 to 300 ohm/sq each;

(6) forming an interlayer dielectric 130, a plurality of source contacts SC, and a plurality of drain contacts DC;

(7) forming a plurality of bitlines 120 (BL) and a plurality of power lines 140 (Vss) so as for 16 said bitlines 120 (BL) to be disposed between two adjacent ones of the power lines 140 to finalize the preliminary fabrication of the multi-level cell NOR flash memory device; and (8) performing an electrical test on the multi-level cell NOR flash memory device, such as, in a preferred embodiment, performing an erasing-programming test thereon followed by writing a soft-programming procedure thereto, the writing a soft-programming procedure thereto further comprises the sub-steps of:

(8-a) performing an erasing procedure thereon;

(8-b) writing a soft-programming procedure to the memory cells at a voltage lower than a voltage applied during a programming procedure; and (8-c) performing the programming procedure thereon.

Accordingly, the multi-level cell NOR flash memory device thus fabricated according to the present invention is advantageously characterized by enhancement of uniformity, durability, and conforming rate because of the specific layout and structure of bitlines, the specific resistance value of source lines, and an erasing-programming test that features soft-programming.

The component insulating structures 102 are field oxide layers, shadow trench isolation (STI), or any isolation that demonstrates an insulating effect. This embodiment is exemplified by shadow trench isolation (STI). In short, the present invention provides a multi-level cell NOR flash memory device that has a relatively high transconductance (GM) due to a special structure thereof and thus reduces the parasitic capacitance which might otherwise be unnecessarily generated. Hence, the multi-level cell NOR flash memory device of the present invention improves the electrical performance of a memory device, that is, the enhancement of the transconductance (GM), uniformity, and conforming rate thereof. In addition, the aforesaid advantages are further augmented by writing a soft-programming procedure to the multi-level cell NOR flash memory device of the present invention. Accordingly, the present invention provides a high-capacity, high-speed, and high-stability multi-level cell NOR flash memory device.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and replacements made to the foregoing embodiments without departing from the spirit and principles in the disclosure of the present invention should fall within the scope of the present invention as set forth in the appended claims. Accordingly, the protection for the present invention should be defined by the appended claims.

What is claimed is:

1. A multi-level cell (MLC) NOR flash memory device, comprising:
   a plurality of gate lines separated from a semiconductor substrate by a gate insulating layer, wherein the gate lines each have a metal silicide layer;
   a plurality of source regions and a plurality of drain regions formed in the semiconductor substrate and between the gate lines;
   a plurality of source lines connected to a portion of the source regions and each being of a sheet resistance of 100 to 300 ohm/sq;
   a plurality of bitlines perpendicular to the source lines and each electrically connected to the drain regions through a plurality of drain contacts; and
   a plurality of power lines parallel to the bitlines and each electrically connected to the source lines through a plurality of source contacts, wherein 16 said bitlines are disposed between two adjacent ones of the power lines;
   a plurality of NOR flash memory cells, each of the NOR flash memory cells having a high transconductance and reduced parasitic capacitance.

2. The device of claim 1, wherein the semiconductor substrate is a silicon (Si) substrate.

3. The device of claim 1, wherein the metal silicide layer is one of cobalt and titanium.

* * * * *